United States Patent [19]
Kartalopoulos

[11] Patent Number: 6,097,724
[45] Date of Patent: Aug. 1, 2000

[54] RAM-BASED ASSOCIATIVE CONTENT-ADDRESSABLE MEMORY DEVICE, METHOD OF OPERATION THEREOF AND ATM COMMUNICATION SWITCHING SYSTEM EMPLOYING THE SAME

[75] Inventor: Stamatios V. Kartalopoulos, Annandale, N.J.

[73] Assignee: Lucent Technologies Inc., Murray Hill, N.J.

[21] Appl. No.: 08/911,646

[22] Filed: Aug. 15, 1997

Related U.S. Application Data

[60] Provisional application No. 60/030,612, Nov. 6, 1996.

[51] Int. Cl.$^7$ .................................................. H04L 12/56
[52] U.S. Cl. .......................................... 370/395; 711/108
[58] Field of Search .................................... 370/363, 368, 370/374, 381, 382, 383, 395, 399, 412; 365/49; 711/108, 111, 112

[56] References Cited

U.S. PATENT DOCUMENTS

| | | | |
|---|---|---|---|
| 4,670,858 | 6/1987 | Almy | 365/49 |
| 5,317,708 | 5/1994 | Edgar | 395/425 |
| 5,329,618 | 7/1994 | Moafi et al. | 395/200 |
| 5,383,146 | 1/1995 | Threewitt | 369/49 |
| 5,422,838 | 6/1995 | Lin | 365/49 |
| 5,450,351 | 9/1995 | Heddes | 365/49 |
| 5,475,825 | 12/1995 | Yonezawa | 395/401 |
| 5,513,134 | 4/1996 | Cooperman et al. | 365/49 |
| 5,515,370 | 5/1996 | Rau | 370/399 |
| 5,706,224 | 1/1998 | Srinivasan et al. | 365/49 |
| 5,806,083 | 9/1998 | Edgar | 711/108 |

OTHER PUBLICATIONS

Mano M. "Computer System Architecture," p. 489–490, Prentice Hall, 1982.

*Primary Examiner*—Douglas W. Olms
*Assistant Examiner*—Ken Vanderpuye

[57] ABSTRACT

A memory device, a method of content-addressing a memory device to validate an incoming pattern and an Asynchronous Transfer Mode (ATM) communication switching system incorporating the device or the method. In one embodiment, the device includes: (1) a validation random access memory (RAM) having a plurality of addressable locations therein, the addressable locations containing validation indicators corresponding to patterns that have been programed into the validation RAM and (2) circuitry, coupled to the validation RAM, that provides an incoming pattern to the validation RAM and retrieves a corresponding validation indicator from the validation RAM, the validation indicator indicating whether the incoming pattern had been programed into the validation RAM. The memory device thereby functions as a content-addressable memory (CAM).

18 Claims, 5 Drawing Sheets

RAM-BASED ASSOCIATIVE CONTENT-ADDRESSABLE MEMORY DEVICE, METHOD OF OPERATION THEREOF AND ATM COMMUNICATION SWITCHING SYSTEM EMPLOYING THE SAME

CROSS-REFERENCE TO RELATED APPLICATION

This Application claims the benefit of U.S. Provisional Application Ser. No. 60/030,612, filed on Nov. 6, 1996, and entitled "A RAM-based Associative Content Addressable Memory," commonly assigned with the present invention and incorporated herein by reference.

TECHNICAL FIELD OF THE INVENTION

The present invention is directed, in general, to memory devices and, more specifically, to a random access memory (RAM)-based associative content-addressable memory (CAM) device, a method of operating a RAM such that it performs as a CAM and an asynchronous transfer mode (ATM) communication switching system employing the same.

BACKGROUND OF THE INVENTION

Content-addressable memory (CAM) devices are typically used in applications requiring fast recognition or validation of a binary pattern. CAM devices can provide a match/no match signal, indicating whether it contains the pattern, in one step. Random Access Memory (RAM) devices, like CAM devices, also store binary patterns. Unlike CAMs, however, pattern retrieval from RAM is much more tedious.

Normally, a system retrieves the pattern from the RAM by addressing a location where the pattern is stored. If the system knows the location of the pattern, the retrieval process is easy. If the system does not know the pattern's location but must nevertheless validate the pattern's presence in the RAM, the system must then use an iterative read and compare process to find the pattern. The system must read each memory location and compare the stored data with the pattern. If it does not find a match, the system must then read the next memory location, repeating the comparison. The system is required to continue this process until it finds a matching pattern or it has searched the complete memory without producing a match. Clearly, this RAM validation process, on average, requires many steps. It is, therefore, significantly less efficient than the CAM validation process, which requires only one step to validate the pattern.

In addition to pattern validation, CAM devices are also used for pattern translation. A CAM-based design would be an ideal solution for fast pattern validation and translation applications such as required in Asynchronous Transfer Mode (ATM) communication switching systems, if not for several significant shortcomings.

First, compared to RAM devices, CAM devices have very limited pattern capacity. Currently, the highest CAM capacity is 4K 32-bit patterns, compared to RAM capacities of 32 Mbits or more. Second, CAM devices dissipate much more power than RAM devices. Although the CAM architecture is similarly scalable like RAM architecture, RAM may be scaled in larger increments. Third, the cost of CAM devices is much higher than RAM devices of similar size and access times. Driven by its use in many wide-ranging applications, the RAM technology continues to advance, particularly in computers. CAM devices, on the other hand, are more specialized and have much more limited uses. As such, CAM technology has not advanced as rapidly. Only a modest increase in bit capacity and a modest decrease in cost may be expected in the future. Fourth and finally, RAM devices are available from many vendors and in many different configurations, allowing users to more easily select the devices most suited for their needs.

Despite these substantial shortcomings, CAM devices possess a pattern validation speed that RAM devices cannot match. Designers developing applications requiring the validation and translation of a large number of patterns have faced a dilemma. Large-scale CAM devices are cost-prohibitive, while RAM devices are unacceptable due to slow pattern validation.

SUMMARY OF THE INVENTION

Accordingly, what is needed in the art is a pattern validation and translation system that marries the exceptional pattern-matching speed of CAM devices to the advantageous attributes of RAM devices, including relatively low cost and high storage capacity. Further, what is needed in the art is an ATM communication switching system that takes advantage of this novel pattern validation and translation system.

To address the above-discussed deficiencies of the prior art, the present invention provides a memory device, a method of content-addressing a memory device to validate an incoming pattern and an ATM communication switching system incorporating the device or the method. In one embodiment, the device includes: (1) a validation RAM having a plurality of addressable locations therein, the addressable locations containing validation indicators corresponding to patterns that have been programed into the validation RAM and (2) circuitry, coupled to the validation RAM, that provides an incoming pattern to the validation RAM and retrieves a corresponding validation indicator from the validation RAM, the validation indicator indicating whether the incoming pattern had been programed into the validation RAM, the memory device thereby functioning as a CAM.

The present invention therefore provides ancillary circuitry that processes-incoming patterns such that a conventional RAM can be made to operate as a CAM without losing its cost and scaleability advantages.

In one embodiment of the present invention, the circuitry provides the incoming pattern to an output of the memory device only if the validation indicator indicates that the incoming pattern had been programed into the validation RAM. In a related embodiment, the circuitry comprises an error counter. A value of the error counter is modified when the validation indicator indicates that the incoming pattern had not been programed into the validation RAM.

In one embodiment of the present invention, the memory device operates in a programing mode in which the circuitry provides a program pattern to the validation RAM and sets a validation indicator in an addressable location in the validation RAM corresponding to the program pattern to a value indicating that the program pattern has been programed into the validation RAM. In a related embodiment wherein an associative RAM is employed, the memory device operates in a programing mode in which the circuitry provides a program pattern to the validation RAM, provides an associative program pattern to the association RAM, sets a validation indicator in an addressable location in the validation RAM corresponding to the program pattern to a value indicating that the program pattern has been programed into the validation RAM and stores the associative pattern in an addressable location in the association RAM corresponding to the program pattern.

In one embodiment of the present invention, the device further comprises an association RAM coupled to the circuitry, the circuitry providing the incoming pattern to the association RAM, retrieving a corresponding associative pattern from the association RAM and providing the associative pattern to an output of the memory device only if the validation indicator indicates that the incoming pattern had been programed into the validation RAM, the validation RAM and association RAM thereby cooperating to function as an associative CAM. With the association RAM, patterns may be verified and then substituted-for. The validation RAM and the association RAM may be consolidated into a common physical device or exist in separate physical devices. Of course, the present invention does not require the association RAM.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
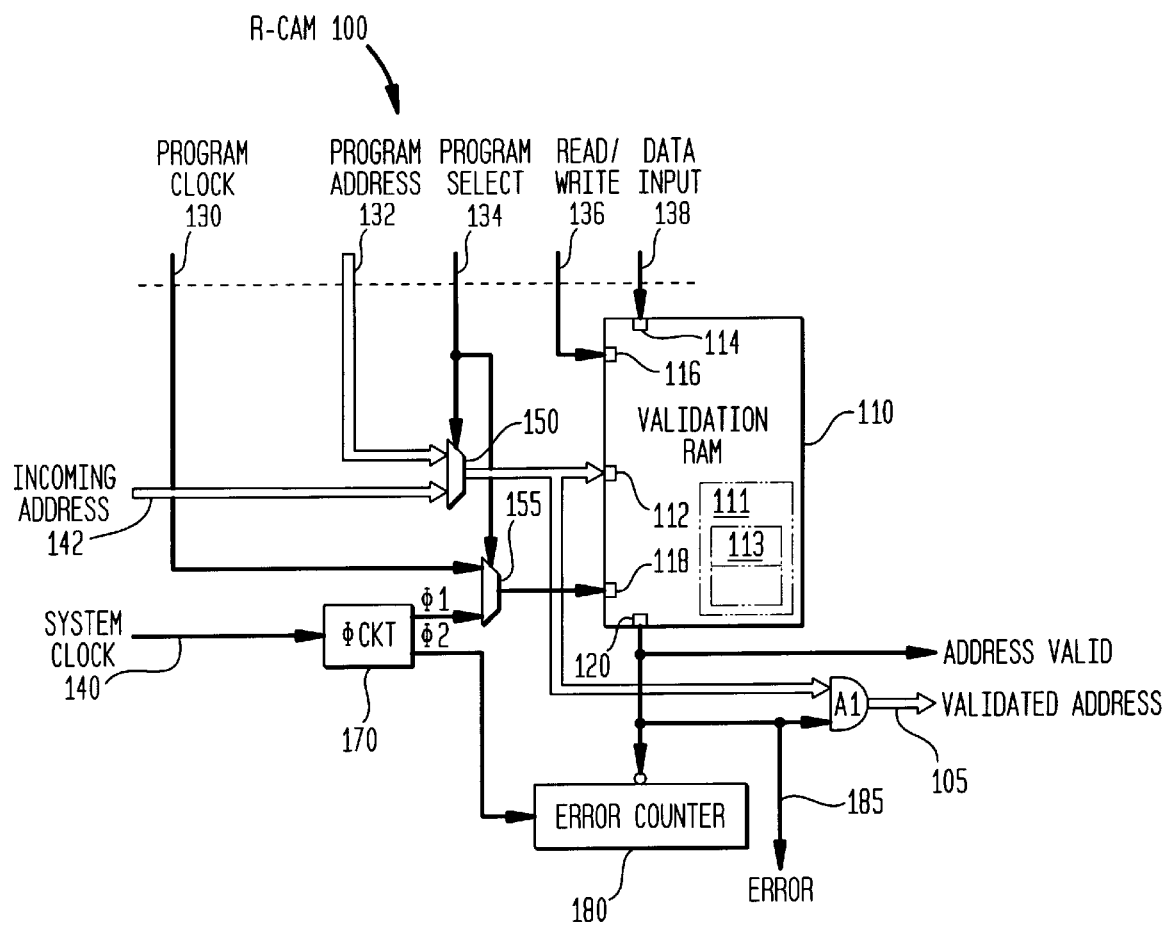
FIG. 1 illustrates an embodiment of a RAM-based CAM (R-CAM) architecture constructed according to the principles of the present invention.

Referring initially to FIG. 1, illustrated is an embodiment of a RAM-based CAM (R-CAM; a memory device) 100 constructed according to the principles of the present invention. The R-CAM 100 includes a validation RAM 110 having an address bus 112, an input data bus 114, a read/write input 116, a clock input 118, an output data bus 120, and a memory 111 containing a plurality of addressable locations (one of which is designated 113) with storage of at least one bit of data per location. Although the present embodiment uses a Random Access Memory (RAM) device, those skilled in the art should realize that the use of any randomly accessible memory device, such as, without limitation, Read Only Memory (ROM), Programmable Read Only Memory (PROM), Erasable Programmable Read Only Memory (EPROM) or Electrically Erasable Read Only Memory (EEPROM), is within the broad scope of the present invention.

The R-CAM 100 further includes circuitry that provides an incoming pattern to the validation RAM 110 and retrieves a corresponding validation bit (or, more broadly, a validation indicator). The circuitry includes, in the illustrated embodiment, a phase generator circuit 170 that receives a system clock signal 140 and generates therefrom a first clock signal $\Phi1$ and a second clock signal $\Phi2$. The phase generator circuit 170 may, for instance, be a simple inverter, generating two clock signals with a 180° phase difference with respect to one another. Those skilled in the art should realize, however, that any circuit that generates two clock signals of differing phases may be used. The circuitry further includes a first selector circuit 150 that, responsive to a program select signal 134, selects an address signal from either a program address 132 or an incoming address 142 and places the selected address signal on the address bus 112. The circuitry further includes a second selector circuit 155 that, responsive to the program select signal 134, selects a clock signal from either the first clock signal $\Phi1$ or a program clock signal 130 and places the selected clock signal on the clock input 118. The circuitry further includes an error counter 180 coupled to the second clock signal $\Phi2$ and the output data bus 120, to provide information for use in system access error detection and monitoring. The circuitry still further includes a gate A1 to gate out the incoming address 142 once it has been validated by the R-CAM 100. The gate A1 blocks invalid addresses from the output of the R-CAM 100. Those skilled in the art should realize that the error counter 180 and the gate A1 are not vital to any embodiment of the present invention and are included for illustrative purposes only.

The R-CAM 100 operates in two alternative modes: a pattern programing mode and a pattern validation mode.

R-CAM Pattern Programing Mode

The pattern programing mode operates substantially as follows. Initially the memory 111 contains a logic zero in all addressable locations 113. The circuitry provides a program pattern at the program address 132. Responsive to the program select signal 134, the first selector circuit 150 routes the program pattern from the program address 132 to the address bus 112 of the validation RAM 110. The second selector circuit 155 routes the program clock signal 130 to the clock input 118 in response to the program select signal 134. Concurrently, the validation bit, in the form of a logic one from a data input 138, is placed on the input data bus 114. A read/write signal 136 activates the read/write input 116, allowing the logic one to be written to the location addressed by the program pattern upon application of the program clock signal 130. A different program pattern addresses a different addressable location 113, where another logic one is written. Once programing is complete, only the locations that have been addressed contain the logic one (signifying that the R-CAM 100 has been exposed only to patterns corresponding to those locations). The remaining addressable locations 113 contains the default logic zeros. Although this particular embodiment selects the logic one to represent a storing of the program pattern, those skilled in the art should realize that any value, logic level or combinations thereof can represent the storing of the program patterns in the addressable locations 113.

R-CAM Pattern Validation Mode

The pattern validation mode operates substantially as follows. The circuitry provides the incoming pattern at the incoming address 142. Responsive to the program select signal 134, the first selector circuit 150 routes the incoming pattern from the incoming address 142 to the address bus 112 of the validation RAM 110. The second selector circuit 155 routes the first clock signal Φ1 to the clock input 118 in response to the program select signal 134. The read/write signal 136 activates the read/write input 116, allowing the addressed location 113 to be read upon application of the first clock signal Φ1. The addressed location 113 yields either the logic one or zero, indicating a presence or absence, respectively, of the incoming pattern. If the incoming pattern is recognized as having been programed into the validation RAM, the logic one at the output data bus 120 activates the gate A1 and enables the incoming pattern to be output from the R-CAM 100 as a validated address 105. If the pattern is not recognized, the logic zero at the output data bus 120 disables the gate A1 and the R-CAM 100 does not yield the incoming pattern. Instead, a value of the error counter is modified, for instance, by advancing the error counter. The logic zero at the output data bus 120 is then used as an error signal 185 to provide useful information for system access error detection, monitoring, and administration. Erroneous system access may be the result of a received error, an unintentional system entry attempt or, more ominously, an intentional malicious system attack. The R-CAM 100 may thus function as a content-addressable memory, performing pattern recognition in one simple step (i.e., one clock cycle). Although this particular embodiment of the present invention includes facilities for system access error detection, those skilled in the art should realize that access detection is not vital to the practice of the present invention and is included for illustrative purposes only. In addition, although this particular embodiment uses a direct addressing scheme that applies both the incoming pattern and the program pattern directly to the address bus 112 of the RAM 110, those skilled in the art should also realize that any addressing scheme, whether relative or absolute, is within the broad scope of the present invention.

Figure 2:
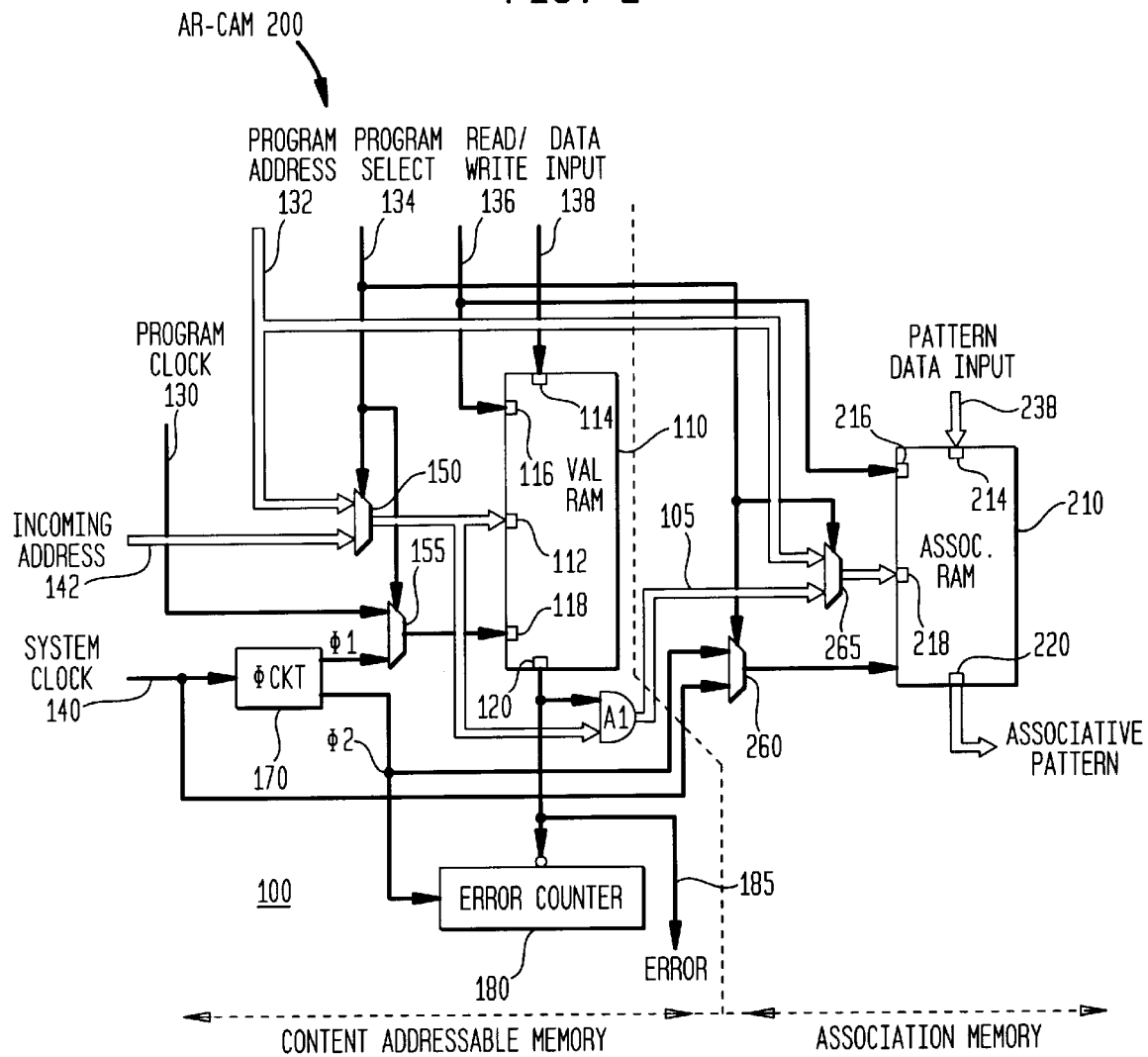
FIG. 2 illustrates an embodiment of an associative RAM-based CAM (AR-CAM) constructed according to the principles of the present invention and incorporating pattern association features.

Turning now to FIG. 2, illustrated is an embodiment of an associative RAM-based CAM (AR-CAM; a memory device) 200 constructed according to the principles of the present invention and incorporating pattern association features. The AR-CAM 200 includes the validation RAM 110 and circuitry as illustrated in FIG. 1. The AR-CAM 200 further includes an association RAM 210, having an address bus 212, an input data bus 214, a read/write input 216, a clock input 218, an output data bus 220, and a memory (not shown) containing a plurality of addressable locations, with storage sufficient to accommodate the length of an associative pattern. Although the present embodiment uses the Random Access Memory (RAM) device, those skilled in the art should realize that the use of any randomly accessible memory device is within the broad scope of the present invention. The AR-CAM 200 further includes additional circuitry that provides an incoming pattern to the association RAM 210 and retrieves a corresponding associative pattern from the association RAM 210. The circuitry includes, in the illustrated embodiment, a third selector circuit 260 that, in response to the program select signal 134, selects the clock signal from either the second clock signal Φ2 or the system clock signal 140 and places the selected clock signal on the clock input 218 of the association RAM 210. The circuitry further includes a fourth selector circuit 265 that, responsive to the program select signal 134, selects the address signal from either the program address 132 or the validated address 105 from the R-CAM 100 and places the selected address signal on the address bus 212 of the association RAM 210.

Analogous to the R-CAM 100, the AR-CAM 200 possesses two alternative modes of operation: a pattern programing mode and a pattern validation and association mode. The operation of the AR-CAM 200 is analogous to the operation of the R-CAM 100 and further includes the following operations.

AR-CAM Pattern Programing Mode

In the pattern programing mode, the third selector circuit 260 routes the system clock signal 140 to the clock input 218 of the association RAM 210 in response to the program select signal 134. Likewise, the fourth selector circuit 265 routes an associative program pattern from the program address 132 to the address bus 212 of the association RAM 210. The corresponding associative pattern from a pattern data input 238 is placed on the input data bus 214 of the association RAM 210. The read/write signal 136 activates the read/write input 216 of the association RAM 210, allowing the associative pattern to be written to a location in the association RAM 210 addressed by the program pattern upon application of the system clock signal 140. The associative pattern is loaded into the association RAM 210 concurrently with the loading of the validation bit into the validation RAM 110.

AR-CAM Pattern Validation and Association Mode

The second mode of operation includes the validation function previously described with respect to the R-CAM 100 and further includes a pattern association function. In this mode, the third selector circuit 260 routes the second clock signal Φ2 to the clock input 218 of the association RAM 210 in response to the program select signal 134. The fourth selector circuit 265 routes the validated address 105 from the R-CAM 100 to the address bus 212 of the association RAM 210. The read/write signal 136 activates the read/write input 216 of the association RAM 210, allowing the location addressed by the validated address 105 to be read upon application of the second clock signal Φ2. The corresponding associative pattern appears at the output data bus 220 of the association RAM 210 and is routed to an output of the memory device. The AR-CAM 200 may thus function as an associative CAM.

The validation RAM 110 and associative RAM 210 may be consolidated into a common physical device to take advantage of the organization of existing RAM devices. RAM devices are typically available in widths of 8 bits or multiples thereof.

Figure 3:
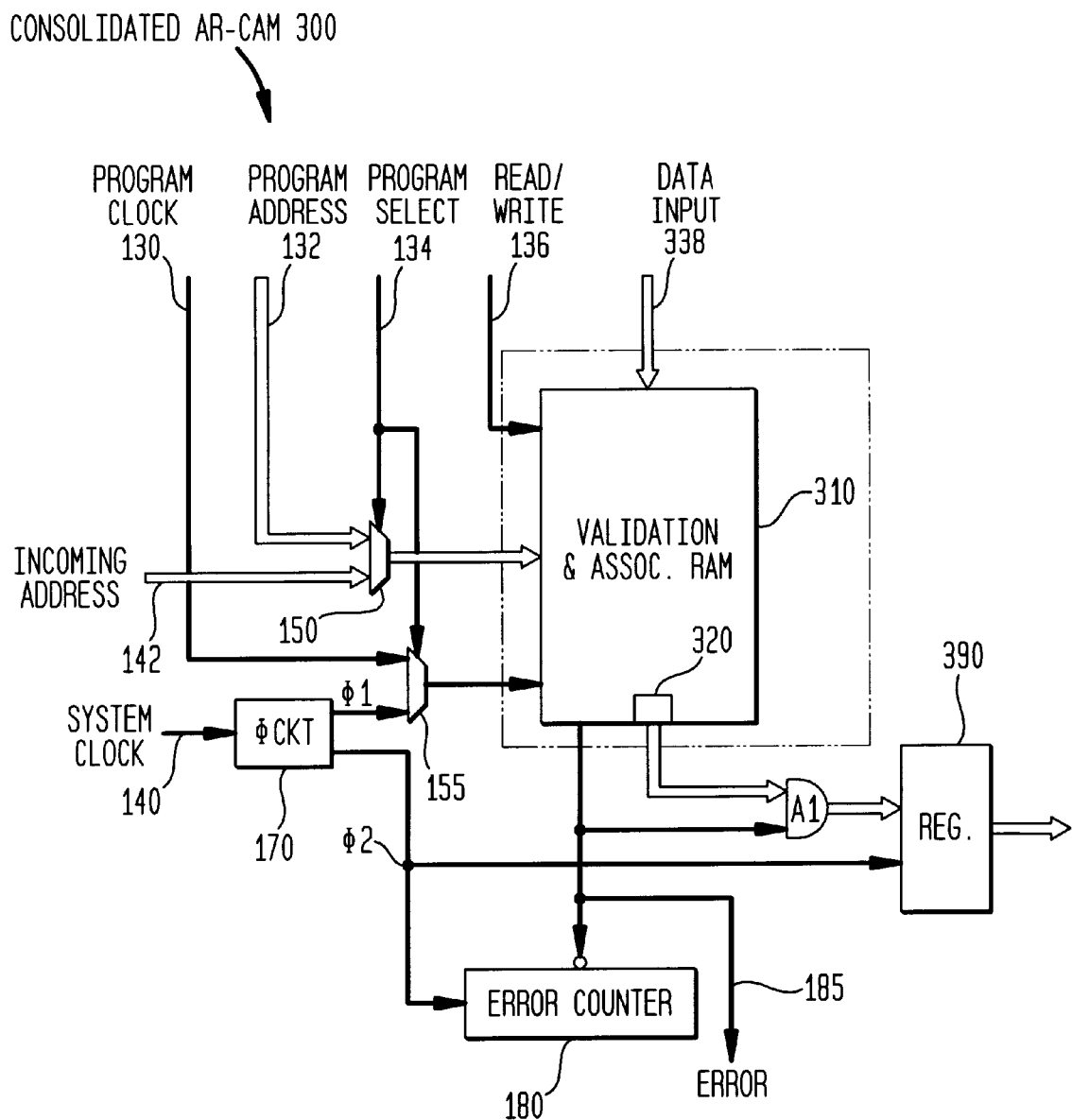
FIG. 3 illustrates an embodiment of a consolidated AR-CAM constructed according to the principles of the present invention.

Turning now to FIG. 3, illustrated is one embodiment of a consolidated AR-CAM (a memory device) 300 constructed according to the principles of the present invention. The consolidated AR-CAM 300 includes the circuitry as illustrated in FIGS. 1 and 2. The consolidated AR-CAM 300 includes a validation and association RAM 310, having an output data bus 320 and a plurality of addressable locations (not shown) with storage sufficient to accommodate both the validation bits and the corresponding associative patterns.

The validation and association RAM 310 is a common physical device, performing the combined functions of both the validation RAM 110 and the association RAM 210 (as previously illustrated and described). Each addressable location of the validation and association RAM 310 may be organized, for instance, such that a first bit contains the validation bit and a plurality of remaining bits contain the associative pattern. Those skilled in the art should understand that the validation and association RAM 310 may be composed of a plurality of RAM devices arranged in parallel to provide sufficient width to accommodate validation bits and associative patterns of any length. The consolidated AR-CAM 300 further includes the gate A1 coupled to the output data bus 320 of the validation and association RAM 310 and feeding an output register 390.

Analogous to the AR-CAM 200 of FIG. 2, the consolidated AR-CAM 300 operates in two alternative modes: the pattern programing mode and the pattern validation and association mode, except for the following differences.

Consolidated AR-CAM Pattern Programing Mode

The programing mode of the consolidated AR-CAM 300 stores both the validation bit and the corresponding associative pattern in the same device, the validation and association RAM 310.

Consolidated AR-CAM Pattern Validation and Association Mode

The validation and pattern association mode of the consolidated AR-CAM 300 extracts both the validation bit and the corresponding associative pattern from the validation and association RAM 310. The gate A1 then uses the validation bit to gate the corresponding associative pattern to the output register 390 upon application of the second clock signal $\Phi 2$. In this embodiment, the second clock signal $\Phi 2$ is delayed slightly from the first clock signal $\Phi 1$ to compensate for delays in reading the validation and association RAM 310.

Figure 4:
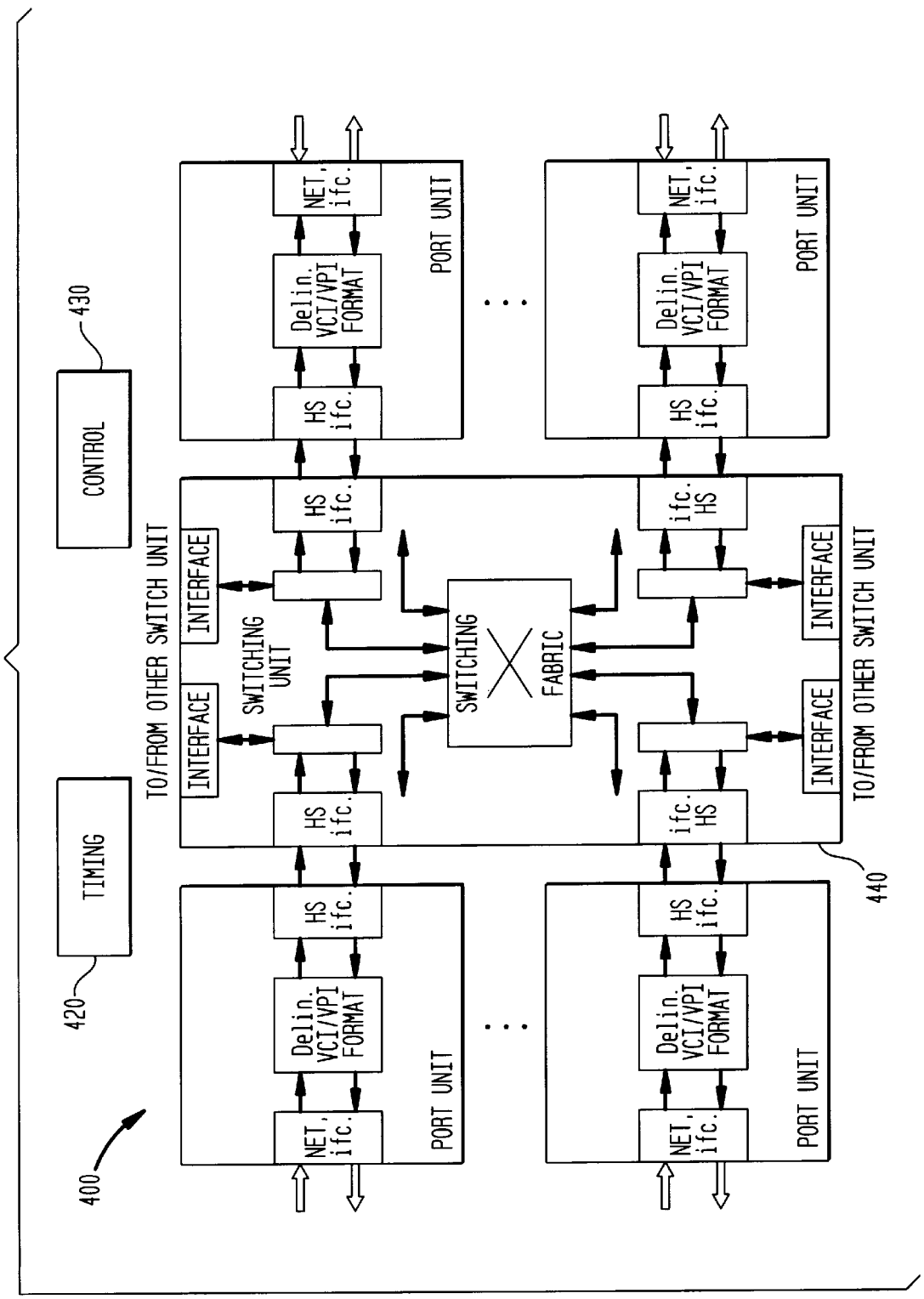
FIG. 4 illustrates an Asynchronous Transfer Mode (ATM) communication switching system.

Turning now to FIG. 4, illustrated is an Asynchronous Transfer Mode (ATM) communication switching system (switching system) 400 that takes advantage of the novel pattern validation and translation system of the present invention. The ATM communication switching system 400 includes a plurality of port units (one of which is designated as 410) that provides an input/output interface for ATM cells received from or transmitted to a communications network. The switching system 400 further includes a timing unit 420 that provides timing information and synchronization to the various components of the switching system 400. The switching system 400 further includes a controller unit 430 that oversees and regulates the operation and integrity of the switching system 400 and the associated components. The timing and controller units 420, 430 are illustrated as separate units but may also be implemented in one combined unit. The switching system 400 further includes a switching unit 440 that switches the ATM cells through the switching system 400 and to the communications network. The switching system 400 receives ATM cells from the communication network. The ATM cell addresses are verified and translated. The ATM cells are then returned to the communications network with new addresses as appropriate.

ATM cells contain an address field that, in network-to-network interfaces (NNI), consists of a Virtual Path Identifier (VPI) field of 12 bits and a Virtual Channel Identifier (VCI) field of 16 bits. With 16 bits, the VCI has a range of 65,536 addresses. ATM networks typically validate and translate the addresses very quickly. The large pattern set and the high pattern recognition and translation speeds required for ATM NNI applications make CAM devices inefficient from a cost standpoint.

Those skilled in the art should be familiar with conventional ATM communications switching systems and, as a result, the operation thereof will not be described in detail. For a better understanding of communications systems in general including ATM communications switching systems, see "Data Network Design," by Darren L. Spohn, McGraw-Hill, Inc. (1993) and "Voice & Data Communications Handbook," by Bud Bates, et al., McGraw-Hill, Inc. (1996), which are incorporated herein by reference.

When ATM cells arrive at the switching system 400, the cells' VPI and VCI addresses are read and translated to new VPI and VCI addresses. At OC-3 rates of 622 Mbps, ATM cells arrive at 350,000 cells/sec, allowing approximately 2.8 $\mu$secs per cell for address validation and translation. Switching systems typically have N OC-3 inputs, and thus 2.8/N $\mu$secs per cell in which to validate and translate the addresses dynamically.

In low performance switching systems, N is small, so 2.8/N $\mu$secs is ample time for pattern recognition and translation with current high performance processor technology and advanced look-up tables. When N is large, however, even high performance processors experience an inability to cope with the large inflow of cells, leading to cell buffering with long queues, additional processing to execute special queuing algorithms, longer transmission delays, and eventually, more design complexity and higher system cost.

CAM devices can perform the pattern validation and association process quickly. As previously mentioned, CAM devices, however, have many disadvantages. Therefore, the present invention uses AR-CAM devices to expedite the pattern validation and association process.

Figure 5:
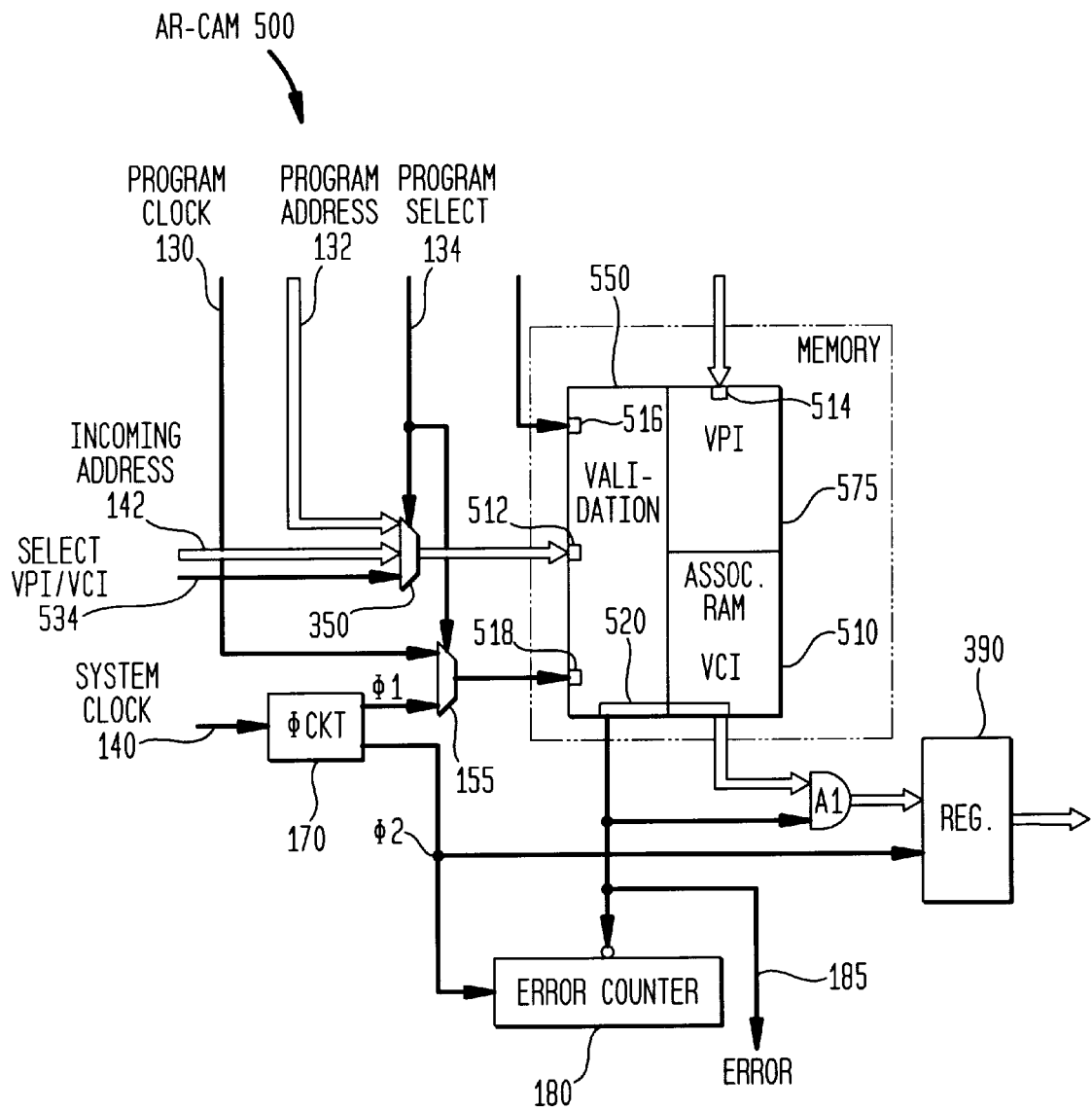
FIG. 5 illustrates another embodiment of a consolidated AR-CAM constructed according to the principles of the present invention.

Turning now to FIG. 5, illustrated is an embodiment of a consolidation AR-CAM 500 constructed according to the principles of the present invention. The AR-CAM 500 is substantially similar to AR-CAM 300 previously described and is implemented in either the port unit 410 or the switching unit 440 of the switching system 400 of FIG. 4. The consolidated AR-CAM 500 includes the circuitry as illustrated in FIGS. 1 and 3. The AR-CAM 500 includes a RAM 510 partitioned into a validation portion 550 and an associative portion 575. The validation and associative portions 550, 575 may also be contained in separate physical devices. The validation portion 550 consists of a plurality of addressable locations wherein validation bits are stored. The associative portion 575 likewise consists of a plurality of addressable locations that, in the illustrated embodiment, is partitioned into two ranges of 64K and 4K locations to store the respective VCI and VPI associative patterns. Each addressable location may be organized such that the first bit contains a validation bit and the plurality of remaining bits contain an associative pattern representing a new VPI or VCI address. The RAM 510 further includes an address bus 512, an input data bus 514, a read/write input 516, a clock input 518 and an output data bus 520. Although the present embodiment uses a RAM device, those skilled in the art should realize that the use of any randomly accessible memory device is within the broad scope of the present invention. The AR-CAM 500 further includes circuitry that determines whether the incoming pattern corresponds to a VPI or a VCI, provides the incoming pattern to the validation portion 550, and retrieves the VPI or VCI associative pattern if the validation bit indicates that the incoming pattern had been programed into the validation portion 550. The circuitry includes a phase generator circuit 170 that receives the system clock signal 140 and generates the first clock signal $\Phi 1$ and the second clock signal $\Phi 2$. The circuitry further includes the first selector circuit 350 that, responsive to the program select signal 134, selects the address signal from either the program address 132 or the incoming address 142 and places the selected address signal on the address bus 512 of the RAM 510. The first selector circuit 350 also determines whether the incoming address 142 is a VPI address or a VCI address and, accordingly, selects the proper address range. The circuitry further includes the second selector circuit 155 that, responsive to the program select signal 134, selects the clock signal from either the first clock signal Φ1 or the program clock signal 130 and places the selected clock signal on the clock input 518 of the RAM 510. The circuitry further includes the error counter 180, coupled to the second clock signal Φ2 and the output data bus 520 of the RAM 510, to provide information for use in error detection and monitoring. The validation bit modifies the error counter to indicate that the incoming pattern has not been programed into the validation portion 550. The circuitry further includes the gate A1 to gate out an associated VPI or VCI address once an input VPI or VCI address has been validated. The circuitry still further includes the output register 390 for temporarily latching the VPI or VCI associative pattern.

Programing the AR-CAM 500 is similar to the processes previously described. For VPI and VCI validation and pattern association, the ATM cell's VPI address is available first, then the VCI address. As soon as the VPI address is available, a select VPI/VCI signal 534 is added to the VPI address to allow access to a VPI section of the RAM 510. The VPI pattern validation and translation then takes place. When the VCI signal becomes available, the select VPI/VCI signal 534 changes to allow access to a VCI section of the RAM 510. Application of valid VCI or VPI addresses allows the system to read the contents of the addressed location, including both the validation bit and the new VCI or VPI address. The output gate A1 then uses the validation bit to gate the new VCI or VPI address to the output register 390 where it is latched for delivery to the ATM cell. The AR-CAM 500 thus functions as an associative CAM for the ATM communications system.

The AR-CAM 500 may be implemented with one small IC or a small programmable logic device and RAM. Since address validation and association may be accomplished in one step, there is no need for very fast RAM devices. Power dissipation and cost is thereby lowered. This particular embodiment of the present invention thus incorporates the advantages of RAM devices, including high access speed, high capacity, low cost and low power consumption, with the high pattern retrieval speed of CAM devices.

Although the present invention has been described in detail, those skilled in the art should understand that they can make various changes, substitutions and alterations herein without departing from the spirit and scope of the invention in its broadest form.

What is claimed is:

1. A memory device, comprising:

a validation random access memory (RAM) having a plurality of addressable locations therein, said addressable locations containing validation indicators corresponding to patterns that have been programed into said validation RAM;

circuitry, coupled to said validation RAM, that provides an incoming pattern to said validation RAM and retrieves a corresponding validation indicator from said validation RAM, said validation indicator indicating whether said incoming pattern had been programed into said validation RAM; and an association RAM coupled to said circuitry, said circuitry providing said incoming pattern to said association RAM, retrieving a corresponding associative pattern from said association RAM and providing said associative pattern to an output of said memory device only if said validation indicator indicates that said incoming pattern had been programed into said validation RAM.

2. The device as recited in claim 1 wherein said circuitry provides said incoming pattern to an output of said memory device only if said validation indicator indicates that said incoming pattern had been programed into said validation RAM.

3. The device as recited in claim 1 wherein said memory device operates in a programming mode in which said circuitry provides a program pattern to said validation RAM and sets a validation indicator in an addressable location in said validation RAM corresponding to said program pattern to a value indicating that said program pattern has been programed into said validation RAM.

4. The device as recited in claim 1 wherein said memory device operates in a programming mode in which said circuitry provides a program pattern to said validation RAM, provides an associative program pattern to said association RAM, sets a validation indicator in an addressable location in said validation RAM corresponding to said program pattern to a value indicating that said program pattern has been programed into said validation RAM and stores said associative pattern in an addressable location in said association RAM corresponding to said program pattern.

5. The device as recited in claim 1 wherein said validation RAM and said association RAM are consolidated into a common physical device.

6. The device as recited in claim 1 wherein said circuitry comprises an error counter, a value of said error counter modified when said validation indicator indicates that said incoming pattern had not been programed into said validation RAM.

7. A method of content-addressing a memory device to validate an incoming pattern, comprising:

providing said incoming pattern to a validation random access memory (RAM) having a plurality of addressable locations therein, said addressable locations containing validation indicators corresponding to patterns that have been programed into said validation RAM;

retrieving a corresponding validation indicator from said validation RAM, said validation indicator indicating whether said incoming pattern had been programed into said validation RAM;

further providing said incoming pattern to an association RAM;

retrieving a corresponding associative pattern from said association RAM; and providing said associative pattern to an output of said memory device only if said validation indicator indicates that said incoming pattern had been programed into said validation RAM.

8. The method as recited in claim 7 further comprising providing said incoming pattern to an output of said memory device only if said validation indicator indicates that said incoming pattern had been programed into said validation RAM.

9. The method as recited in claim 7 further comprising operating said memory device in a programming mode, including:

providing a program pattern to said validation RAM; and setting a validation indicator in an addressable location in said validation RAM corresponding to said program pattern to a value indicating that said program pattern has been programed into said validation RAM.

10. The method as recited in claim 7 further comprising operating said memory device in a programming mode, including:

providing a program pattern to said validation RAM;

providing an associative program pattern to said association RAM;

setting a validation indicator in an addressable location in said validation RAM corresponding to said program pattern to a value indicating that said program pattern has been programed into said validation RAM; and storing said associative pattern in an addressable location in said association RAM corresponding to said program pattern.

11. The method as recited in claim 7 wherein said validation RAM and said association RAM are consolidated into a common physical device.

12. The method as recited in claim 7 further comprising modifying a value of an error counter when said validation indicator indicates that said incoming pattern had not been programed into said validation RAM.

13. An Asynchronous Transfer Mode (ATM) communication switching system, comprising:

a port unit that provides an input/output interface for ATM cells received from or transmitted to a communications network;

a timing and controller unit that synchronizes and regulates an operation of components associated with said ATM communication switching system;

a switching unit that switches said ATM cells through said ATM communication switching system; and a random access memory (RAM), including:
a validation portion having a plurality of addressable locations containing validation indicators corresponding to patterns that have been programed into said validation portion, and
an association portion having a plurality of addressable locations containing Virtual Path Identifier (VPI) and Virtual Channel Identifier (VCI) associative patterns; and circuitry, coupled to said RAM, that determines whether an incoming pattern, associated with said ATM cell, corresponds to a VPI or a VCI, provides said incoming pattern to said validation portion and retrieves a corresponding validation indicator from said RAM, said validation indicator indicating whether said incoming pattern had been programed into said validation portion, said circuitry retrieving-said VPI or VCI associative pattern from said RAM only if said validation indicator indicates that said incoming pattern had been programed into said validation portion.

14. The system as recited in claim 13 wherein said circuitry provides, said incoming pattern to an output of said system only if said validation indicator indicates that said incoming pattern had been programed into said validation RAM.

15. The system as recited in claim 13 wherein said RAM and circuitry operate in a programing mode in which said circuitry provides a program pattern to said validation portion, provides a VPI or VCI associative program pattern to said association portion, sets a validation indicator in an addressable location in said validation portion corresponding to said program pattern to a value indicating that said program pattern has been programed into said validation portion and stores said associative pattern in an addressable location in said association portion corresponding to said program pattern.

16. The system as recited in claim 13 wherein said validation portion and said association portion are contained in separate physical devices.

17. The system as recited in claim 13 wherein said circuitry comprises an error counter, a value of said error counter modified when said validation indicator indicates that said incoming pattern had not been programed into said validation portion.

18. The system as recited in claim 13 further comprising an output register, coupled to said RAM, that temporarily latches said VPI or VCI associative pattern.

* * * * *